(12) United States Patent
Sumitani

(10) Patent No.: US 10,418,268 B2
(45) Date of Patent: Sep. 17, 2019

(54) VACUUM APPARATUS AND METHOD FOR MANUFACTURING SEMICONDUCTOR DEVICE

(71) Applicant: Mitsubishi Electric Corporation, Tokyo (JP)

(72) Inventor: Koichi Sumitani, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 223 days.

(21) Appl. No.: 14/925,297

(22) Filed: Oct. 28, 2015

(65) Prior Publication Data

US 2016/0247705 A1    Aug. 25, 2016

(30) Foreign Application Priority Data

Feb. 25, 2015    (JP) ................. 2015-034895

(51) Int. Cl.
     *H01L 21/68*      (2006.01)
     *H01L 21/683*      (2006.01)
     *H01L 21/67*      (2006.01)

(52) U.S. Cl.
     CPC .... *H01L 21/6838* (2013.01); *H01L 21/67253* (2013.01)

(58) Field of Classification Search
     CPC ............ H01L 21/6838; H01L 21/67253; B25J 19/022
     USPC .......................... 414/800; 294/99.1, 183, 185
     See application file for complete search history.

(56) References Cited

U.S. PATENT DOCUMENTS

| | | | | |
|---|---|---|---|---|
| 2,922,873 A | * | 1/1960 | Bibbero | F21V 33/008 294/185 |
| 3,458,102 A | * | 7/1969 | Szasz | H01L 21/67144 219/85.18 |
| 3,661,316 A | * | 5/1972 | Kulicke, Jr. | H01L 24/78 228/4.1 |
| 3,734,593 A | * | 5/1973 | Mori | G02B 21/22 353/42 |
| 4,470,670 A | * | 9/1984 | Ingle | B23K 20/004 228/56.5 |
| 4,496,180 A | * | 1/1985 | Hillman | B65G 47/91 271/90 |

(Continued)

FOREIGN PATENT DOCUMENTS

| | | |
|---|---|---|
| CN | 1284162 A | 2/2001 |
| JP | S60-186378 A | 9/1985 |

(Continued)

OTHER PUBLICATIONS

An Office Action mailed by the Chinese Patent Office dated May 12, 2017, which corresponds to Chinese Patent Application No. 201610104646.3 and is related to U.S. Appl. No. 14/925,297; with English language Concise Explanation.

(Continued)

*Primary Examiner* — Lynn E Schwenning
(74) *Attorney, Agent, or Firm* — Studebaker & Brackett PC

(57) ABSTRACT

A vacuum tweezer includes: a tweezer body including a suction distal end portion that performs vacuum suction of an object to be suctioned; and a light source causing a beam to be condensed at a position on an extension of the suction distal end portion on which a vacuum suction force acts.

8 Claims, 4 Drawing Sheets

(56) References Cited

U.S. PATENT DOCUMENTS

| | | | | |
|---|---|---|---|---|
| 4,589,773 | A * | 5/1986 | Ido | G01B 11/026 250/205 |
| 4,770,454 | A * | 9/1988 | Muscher | B65G 47/1485 414/752.1 |
| 4,864,899 | A * | 9/1989 | Morse | H01K 3/32 294/86.4 |
| 4,904,012 | A | 2/1990 | Nishiguchi | |
| 4,969,107 | A * | 11/1990 | Mizutani | B25J 9/1684 219/124.34 |
| 4,969,676 | A * | 11/1990 | LaMagna | B65G 47/911 294/64.3 |
| 5,106,139 | A * | 4/1992 | Palmer | B25B 11/007 29/743 |
| 5,119,759 | A * | 6/1992 | Hicks | B23K 3/06 118/323 |
| 5,163,728 | A * | 11/1992 | Miller | H01L 21/68707 29/740 |
| 5,538,305 | A * | 7/1996 | Conway | B25J 7/00 294/119.1 |
| 5,928,537 | A * | 7/1999 | Fortune | H05K 13/0447 219/228 |
| 6,065,789 | A * | 5/2000 | Nagai | B41F 21/06 294/185 |
| 6,145,900 | A * | 11/2000 | Jung | B25B 11/007 414/752.1 |
| 6,527,439 | B1 | 3/2003 | Bellifemine | |
| 7,066,513 | B2 * | 6/2006 | Yamanaka | B82B 3/00 294/86.4 |
| 8,403,388 | B1 * | 3/2013 | Wendt | B25J 15/0616 294/100 |
| 2013/0055541 | A1 * | 3/2013 | Mizuno | H01L 21/6838 29/407.04 |

FOREIGN PATENT DOCUMENTS

| | | |
|---|---|---|
| JP | H02-035677 U | 3/1990 |
| JP | H05-212050 A | 8/1993 |
| JP | 2005-131721 A | 5/2005 |
| JP | 2007-069337 A | 3/2007 |

OTHER PUBLICATIONS

CN Office Action dated Jan. 30, 2018, from corresponding CN Appl No. 201610104646.3, with English translation, 15 pp.

* cited by examiner

VACUUM APPARATUS AND METHOD FOR MANUFACTURING SEMICONDUCTOR DEVICE

BACKGROUND OF THE INVENTION

Field of the Invention

The present invention relates to a vacuum tweezer for picking up an object to be suctioned such as a semiconductor chip and a method for manufacturing a semiconductor device using the same.

Background Art

When a semiconductor chip is manually picked up, a suction distal end portion of a vacuum tweezer is brought closer to the semiconductor chip, the semiconductor chip is suctioned by a vacuum suction force and moved to a chip tray or package or the like. The vacuum tweezer include a tweezers section, a controller section, and a compressed air supply hose or a vacuum hose (e.g., see Japanese Utility Model Laid-Open No. 2-35677).

SUMMARY OF THE INVENTION

When the semiconductor chip is picked up by using the vacuum tweezer, it is necessary to cause the suction distal end portion of the vacuum tweezer to approach the semiconductor chip to within a reach of the vacuum suctioning force. In this case, the vacuum tweezer may be brought too close and carelessly come into contact with the semiconductor chip, damaging the chip surface and turning the chip into a defective item. Therefore, skilled personal needs to be assigned to this work. Moreover, since there is an array of so many semiconductor chips to be picked up, a problem may occur that chips which are different from a desired chip are erroneously picked up.

The present invention has been implemented to solve the above-described problems, and it is therefore an object of the present invention to provide a vacuum tweezer and a method for manufacturing a semiconductor device capable of causing a suction distal end portion to easily approach a desired object to be suctioned and preventing deterioration of yield of products.

According to the present invention, a vacuum tweezer includes: a tweezer body including a suction distal end portion that performs vacuum suction of an object to be suctioned; and a light source causing a beam to be condensed at a position on an extension of the suction distal end portion on which a vacuum suction force acts.

The present invention makes it possible to cause a suction distal end portion to easily approach a desired object to be suctioned and prevent deterioration of yield of products.

Other and further objects, features and advantages of the invention will appear more fully from the following description.

DETAILED DESCRIPTION OF THE PREFERRED EMBODIMENTS

A vacuum tweezer and a method for manufacturing a semiconductor device according to the embodiments of the present invention will be described with reference to the drawings. The same components will be denoted by the same symbols, and the repeated description thereof may be omitted.

First Embodiment

Figure 1:
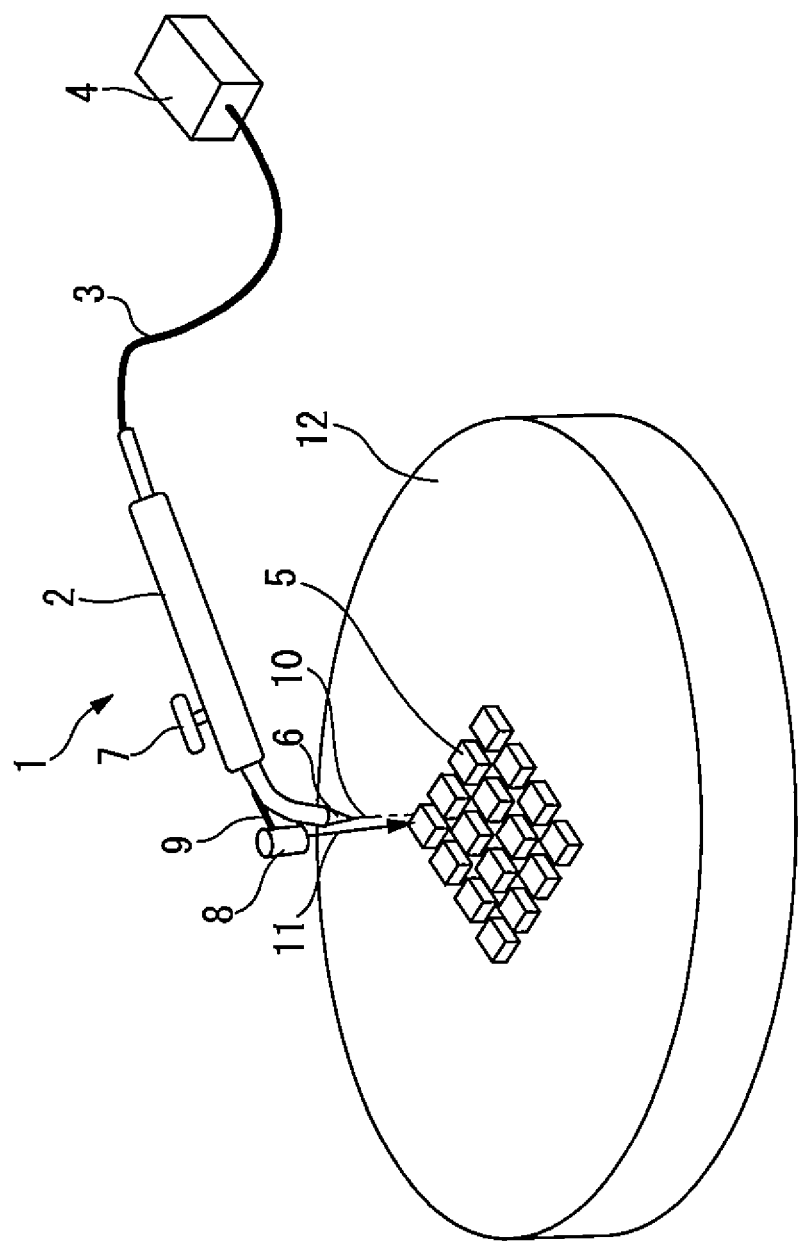
FIG. 1 is a perspective view illustrating a method for manufacturing a semiconductor device using a vacuum tweezer according to Embodiment 1 of the present invention.

FIG. 1 is a perspective view illustrating a method for manufacturing a semiconductor device using a vacuum tweezer according to Embodiment 1 of the present invention. A vacuum pump 4 is connected to a tweezer body 2 of the vacuum tweezer 1 via a vacuum hose 3. The tweezer body 2 includes a suction distal end portion 6 that performs vacuum suction of a semiconductor chip 5 which is an object to be suctioned. The tweezer body 2 is provided with a suction switchover button 7 that switches suction operation. A laser pointer 8 is fixed to the tweezer body 2 by a fixing jig 9. The laser pointer 8 causes a laser beam 11 to be condensed on an extension 10 of the suction distal end portion 6 by using a lens.

A wafer pasted to a dicing sheet 12 is divided into individual semiconductor chips 5. The suction distal end portion 6 of the vacuum tweezer 1 is brought closer to a desired semiconductor chip 5 and the chip is picked up by suctioning it by a vacuum suction force and moved to a tray (not shown). Afterwards, the vacuum tweezer 1 are also used in other steps such as a step of transferring the semiconductor chip 5 to another tray.

Figure 2:
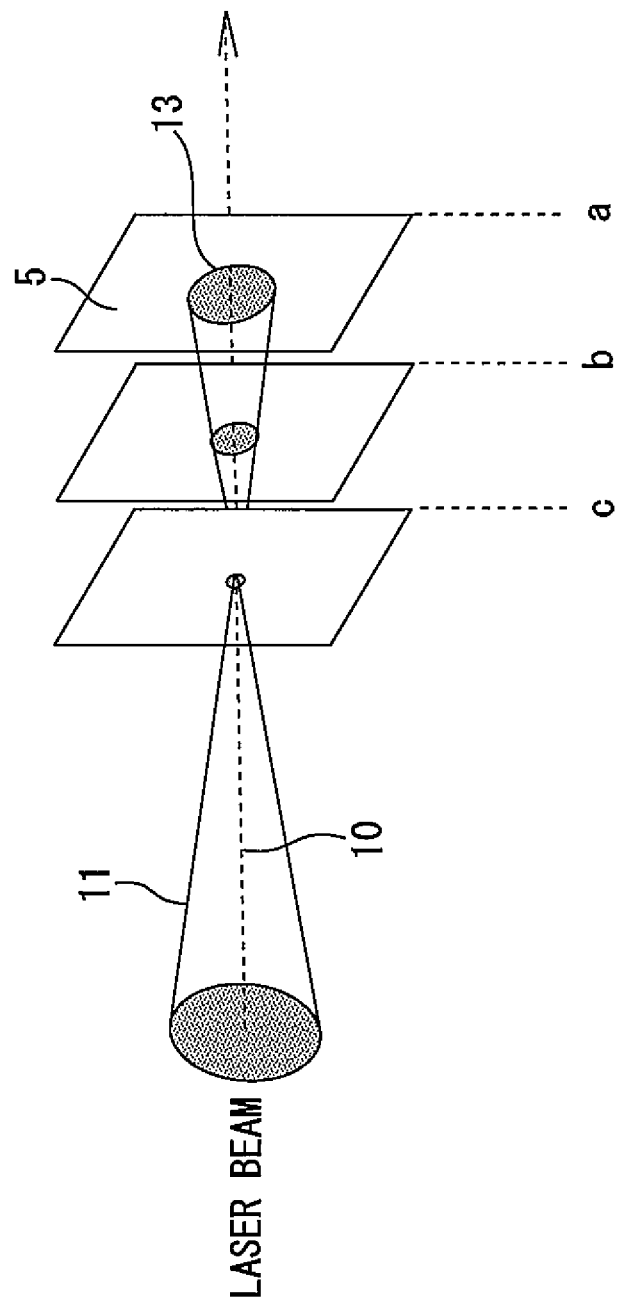
FIG. 2 is a schematic view illustrating a method for grasping a distance from the suction distal end portion of the vacuum tweezer according to Embodiment 1 of the present invention to the semiconductor chip.

FIG. 2 is a schematic view illustrating a method for grasping a distance from the suction distal end portion of the vacuum tweezer according to Embodiment 1 of the present invention to the semiconductor chip. As the distance from the suction distal end portion 6 to the semiconductor chip 5 decreases in order of a, b and c, the magnitude of reflected light 13 of the laser beam 11 changes. Thus, the vacuum tweezer 1 are set so that the laser beam 11 is condensed at a position on the extension 10 of the suction distal end portion 6 on which the vacuum suction force acts. This allows the operator to easily grasp the position and range in which the suction distal end portion 6 of the vacuum tweezer 1 should approach so as to be able to suction the semiconductor chip. Therefore, the suction distal end portion 6 can easily approach the desired semiconductor chip 5, and thereby drastically reduce the possibility that the vacuum tweezer 1 may cause damage to the surface of the semiconductor chip 5 producing a defective product, and can prevent deterioration of the yield of products. Furthermore, mastery of the operation becomes so easy that the operation can be performed by even non-skilled operators.

Figure 4:
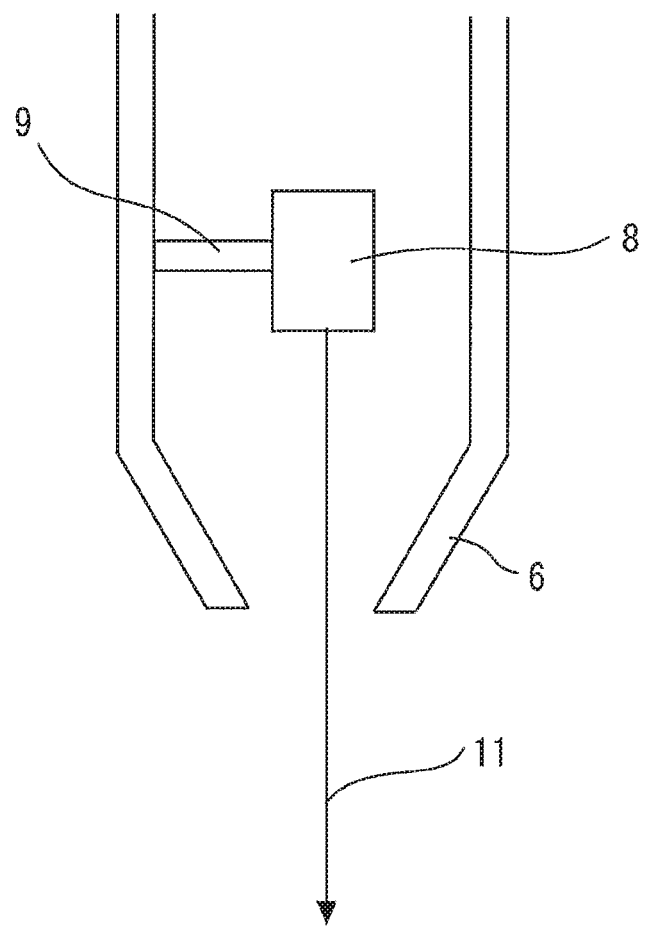
FIG. 4 is a schematic view illustrating an alternative vacuum apparatus according to Embodiment 1 of the present invention.

In FIG. 1, the laser pointer 8 is externally attached to the tweezer body 2. But, as shown in FIG. 4, the laser pointer 8 may also be placed inside the suction distal end portion 6 and the laser beam 11 may be radiated from the distal end port of the suction distal end portion 6. In this case, since the optical axis of radiation is aligned with the distal end port of the suction distal end portion 6, alignment can be performed at a distance far from the semiconductor chip 5 to be suctioned.

Second Embodiment

Figure 3:
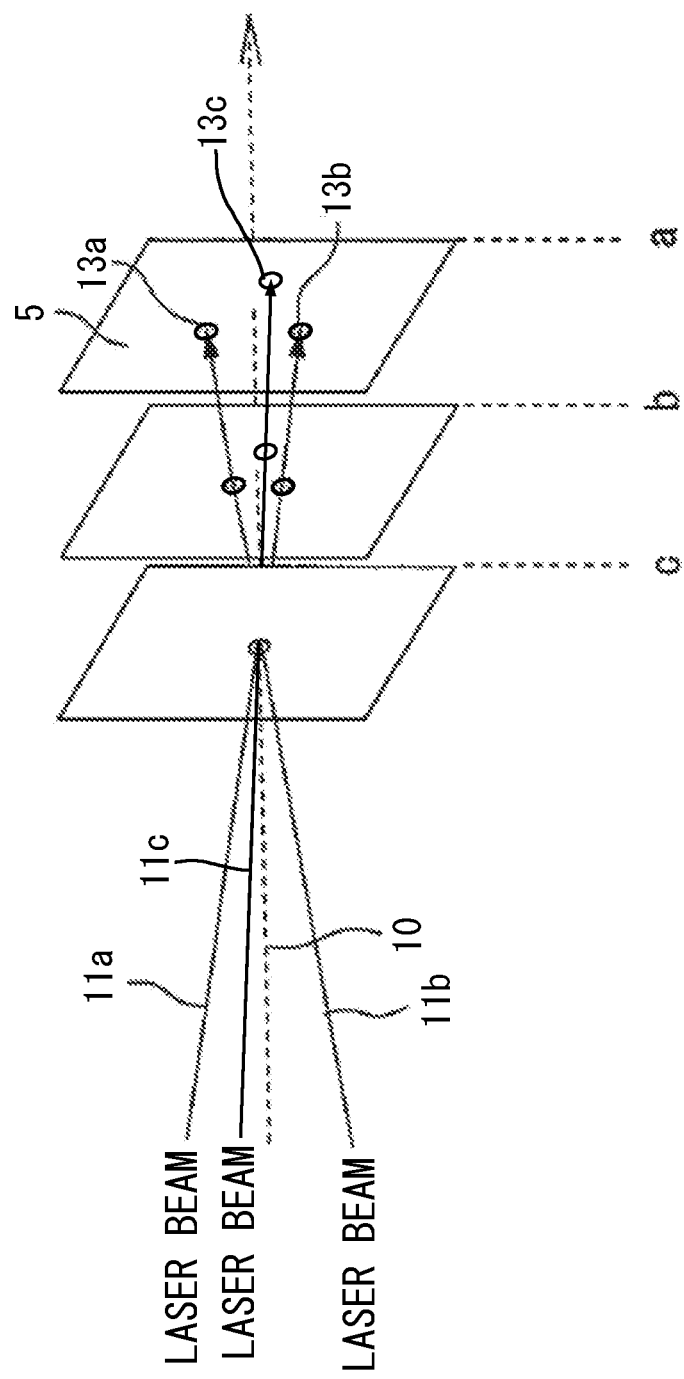
FIG. 3 is a schematic view illustrating a method for grasping a distance from the suction distal end portion of the vacuum tweezer to a semiconductor chip according to Embodiment 2 of the present invention.

FIG. 3 is a schematic view illustrating a method for grasping a distance from the suction distal end portion of the vacuum tweezer to a semiconductor chip according to Embodiment 2 of the present invention. In the present embodiment, two laser beams 11a and 11b are caused to cross each other on the extension 10 of the suction distal end portion 6. As the distance decreases in order of a, b and c, two reflected light beams 13a and 13b come closer to each other and become one at a point of intersection. Thus, the vacuum tweezer are set so that the two laser beams 11a and 11b cross each other at a position on the extension 10 of the suction distal end portion 6 on which a vacuum suction force acts. This allows the operator to easily grasp the position and range in which the suction distal end portion 6 of the vacuum tweezer 1 should approach so as to be able to suction the semiconductor chip, thus making it possible to obtain effects similar to those in Embodiment 1.

In the present embodiment, the two laser beams 11a and 11b are used, but, as also shown in FIG. 3, three laser beams, including laser beam 11c, are preferably used. This makes it possible to grasp not only the distance of the semiconductor chip 5 from the suctioning surface but also an angle of contact from overlapping among the laser reflected beams and thereby improve stability of a pickup operation.

Moreover, the three laser beams 11a, 11b and 11c preferably have mutually different colors. For example, if red and green laser beams are used for laser beams 11a and 11b, it is possible to confirm overlapping among the beams from a variation in colors. A third color other than red and green can be used for laser beam 11c.

Furthermore, in the present embodiment, a plurality of laser pointers are provided to obtain a plurality of laser beams, but without being limited to this, one laser beam radiated from the one laser pointer 8 may be branched into a plurality of laser beams by using an optical fiber.

In Embodiments 1 and 2, the laser pointer 8 is attached to the tweezer body 2, but without being limited to this, the laser pointer 8 may be separated from the tweezer body 2 so that the laser beam radiated from the laser pointer 8 may be guided to the tweezer body 2 via an optical fiber. This will reduce the weight of the tweezers themselves and improve the operability. In Embodiments 1 and 2, the laser pointer 8 is used, but without being limited to this, other light sources such as LED may also be used.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2015-034895, filed on Feb. 25, 2015 including specification, claims, drawings and summary, on which the Convention priority of the present application is based, is incorporated herein by reference in its entirety.

What is claimed is:

1. A vacuum apparatus comprising:
   a body including a suction distal end portion that performs vacuum suction of an object to be suctioned; and
   a laser light source radiating a light beam from a location on the body, the light beam being condensed to a minimum diameter at a position extended from the suction distal end portion, the position being a location on which a vacuum suction force from the suction distal end portion acts, the position being a non-contact location of the suction distal end portion with the object.

2. The vacuum apparatus of claim 1, wherein the light source is placed inside the suction distal end portion and the light beam is radiated from a distal end port of the suction distal end portion.

3. A vacuum apparatus comprising:
   a body including a suction distal end portion that performs vacuum suction of an object to be suctioned; and
   a laser light source positioned on the body and outputting a plurality of beams, the plurality of beams positioned to cause the plurality of beams to cross each other at a position extended from the suction distal end portion, the position being a location on which a vacuum suction force from the suction distal end portion acts on the object, the position being a non-contact location of the suction distal end portion with the object.

4. The vacuum apparatus of claim 3, wherein the plurality of beams are three beams.

5. The vacuum apparatus of claim 3, wherein the plurality of beams have mutually different colors.

6. A vacuum apparatus comprising:
   a body including a suction distal end portion that performs vacuum suction of an object to be suctioned; and
   a laser light source outputting a plurality of beams from a location on the body, the plurality of beams positioned to overlap at a spaced distance from the suction distal end portion, the spaced distance being a distance at which a vacuum suction force from the suction distal end portion acts, the position being a non-contact location of the suction distal end portion with the object.

7. The vacuum apparatus of claim 6, wherein the plurality of beams are three beams.

8. The vacuum apparatus of claim 6, wherein the plurality of beams have mutually different colors.

* * * * *